United States Patent
Tanaka

(10) Patent No.: US 8,121,161 B2
(45) Date of Patent: Feb. 21, 2012

(54) LASER DIODE DRIVER DRIVEN IN SHUNT MODE BY SIGNALS COMPLEMENTARY TO EACH OTHER

(75) Inventor: Keiji Tanaka, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 497 days.

(21) Appl. No.: 12/476,654

(22) Filed: Jun. 2, 2009

(65) Prior Publication Data

US 2010/0135675 A1    Jun. 3, 2010

(30) Foreign Application Priority Data

Jun. 3, 2008    (JP) ................................. 2008-145963

(51) Int. Cl.
*H01S 3/13*    (2006.01)
*H01S 3/00*    (2006.01)

(52) U.S. Cl. .............. 372/38.02; 372/29.015; 372/38.07

(58) Field of Classification Search ............. 372/29.015, 372/38.02, 38.07
See application file for complete search history.

(56) References Cited

U.S. PATENT DOCUMENTS 6,618,408 B1    9/2003    Mader et al.

*Primary Examiner* — Armando Rodriguez
(74) *Attorney, Agent, or Firm* — Venable LLP; Michael A. Satori; Leigh D. Thelen

(57) ABSTRACT

A laser driver to drive an LD in the shunt mode and driven with signals complementary to each other is disclosed. The driver includes two FETs of the enhancement and a terminator. Two FETs are connected in parallel with the LD and driven by the complementary signals but have sizes different from each other. The terminator is connected between respective gate terminals of the FET. The driver further includes a capacitor that compensates the difference in the size of two FETs, which is substantially equal to a magnitude of the junction capacitance of the FET. The capacitor is integrated with the FETs.

11 Claims, 4 Drawing Sheets

LASER DIODE DRIVER DRIVEN IN SHUNT MODE BY SIGNALS COMPLEMENTARY TO EACH OTHER

BACKGROUND OF THE INVENTION

1. Field of the Invention

The present invention relates to a laser diode (hereafter denoted as LD) driver, in particular, the invention relates to a laser driver with a shunt mode and driven with signals complementary to each other.

2. Related Prior Art

A United States Patent, the U.S. Pat. No. 6,618,408, has disclosed a laser driver with the shunt mode. The shunt driver includes a transistor connected in parallel to the LD. The gate electrode of the transistor receives the modulating signal, the source electrode being grounded common to the cathode of the LD, and the drain electrode is connected with the anode of the LD. Thus, the transistor may shunt the current externally supplied to the LD by the modulating signal applied to the gate electrode thereof.

When we set the shunt transistor to be an n-channel enhancement FET (hereafter denoted as E-FET), which often shows an effective cost, a positive DC bias of 0.7-1.0 V is necessary to be applied to the gate electrode of the transistor. While, a terminator is necessary to be coupled with the input terminal to reduce the signal reflection at the input terminal in high frequencies. When the input terminal is offset in the DC mode, this DC offset voltage results in the DC current flowing in the terminator directly connected to the ground, which increases ineffective power consumption.

Although a terminating capacitor may isolate the input terminal in the DC mode but ground in the AC mode, the capacitance thereof is necessary to be large enough so as not to affect the frequency response of the terminator in low frequencies. Such a capacitor with larger capacitance is substantially impossible to be integrated with in an IC, and inevitably set in the outside of the IC. A bonding wire may electrically connect such capacitor with the IC, but degrades the high frequency response of the terminator due to the parasitic inductance inherently attributed with the bonding wire.

SUMMARY OF THE INVENTION

One aspect of the present invention relates to a laser driver that is driven by signals complementary to each other. The laser driver comprises a first transistor, a second transistor, and a terminator. Two transistors are commonly connected in parallel with the laser diode. The first transistor receives one of the complementary signals with a normal phase, while, the second transistor receives the other of the complementary signals with an opposite phase. The terminator is connected between control electrodes of the transistor to terminate the complementary signals. In the present invention, the size of the first transistor is larger than the size of the second transistor. When the transistors are the enhancement type FET with the same gate length, the size of the transistor is denoted by the gate width.

According to the laser driver of the present invention, both transistors are driven by the complementary signals and commonly connected in parallel to the LD to shunt the bias current for the LD in accordance with the differential signal, the high frequency performance of the laser driver may be secured without degrading the power consumption of the laser driver, because the terminator is connected between two inputs for the differential signals not to the ground.

The laser driver of the invention may further provide a capacitor to compensate the difference in the size of two transistors. The capacitor may be connected in parallel with the input electrode of the other transistor to receive the opposite phase signal. The capacitance of this capacitor may be equivalent to a difference in the junction capacitance of two transistors. Thus, the laser driver with the capacitor may compensate an unbalance in the inputs thereof.

Another aspect of the present invention relates to an optical transmitter that includes the laser driver, an LD, a current source to provide a bias current and a package. The laser driver may shunt the bias current supplied from the current source through an inductor to the LD in accordance with the differential signal applied thereto. The package, which encloses the LD and the laser driver therein but excludes the current source, has two input terminals to receive the differential signals and a current terminal to receive the bias current. The laser driver includes two transistors each having different sizes and being connected to respective input terminals, a terminator connected between the input terminals of the package and a capacitor connected to one of the input terminals. In the present invention, the capacitor may compensate the junction capacitance of the transistors. The sizes of respective transistors may have a ratio greater than 30.

DESCRIPTION OF PREFERRED EMBODIMENTS

Next, preferred embodiments according to the present invention will be described. In the explanation of the drawings, the same numerals or symbols will refer to the same elements or the equivalents thereof without overlapping descriptions.

Figure 1:
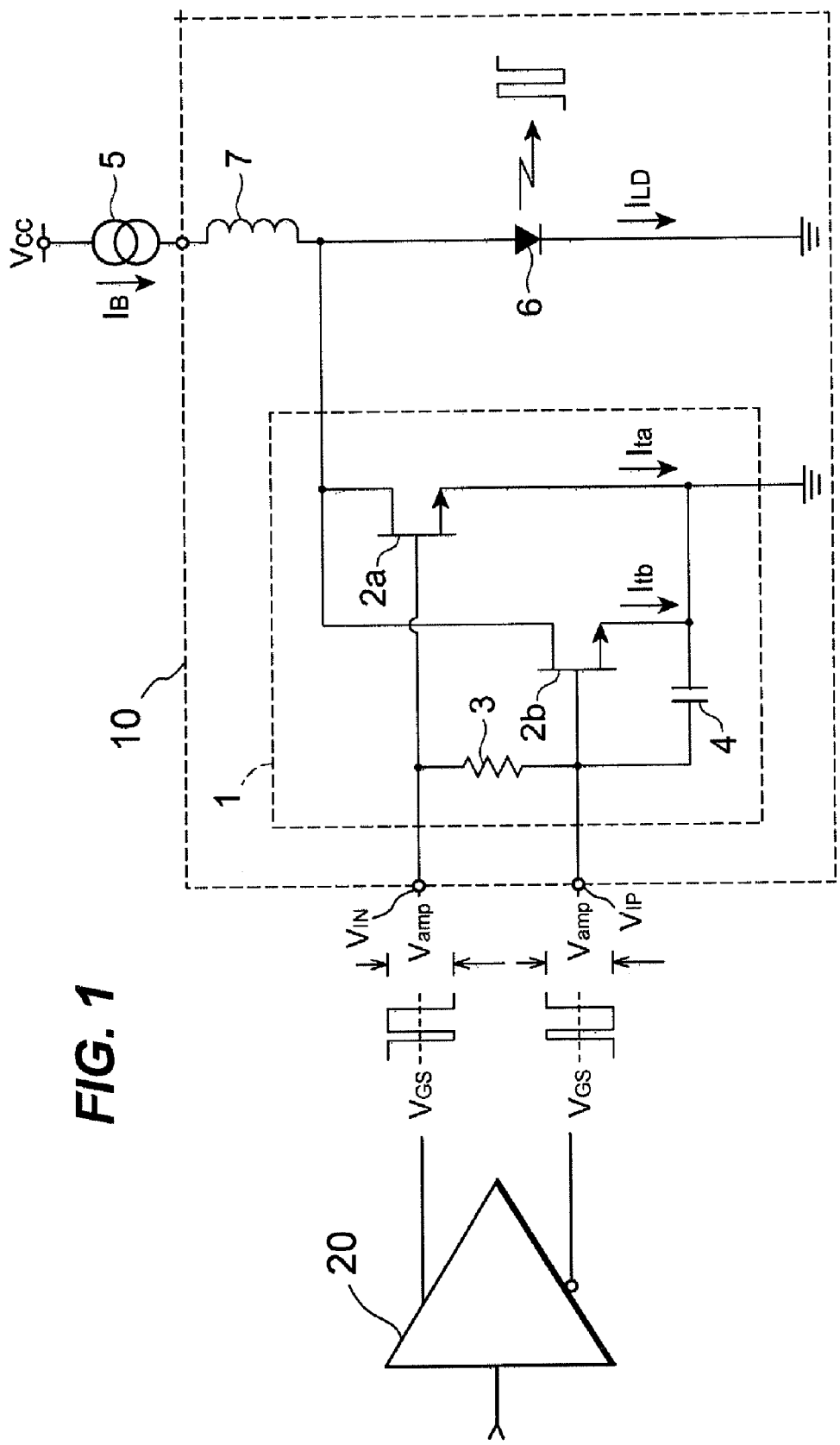
FIG. 1 is a block diagram of an optical transmitter that includes a laser driver according to an embodiment of the present invention.

FIG. 1 shows an exemplary circuit diagram of a laser driver according to an embodiment of the present invention. The laser driver 1 in FIG. 1 includes two FETs 2a and 2b, with the enhancement configuration, a terminator 3, and a capacitor 4, where the laser driver 1 drives a laser diode 6 by shunting a current $I_B$ provided from an external current source 5. The laser driver 1 may be driven by a differential circuit 20 connected in the upstream of the laser driver 1. The differential circuit 20, for instance, converts a mono-phase signal provided thereto into signals complementary to each other. One of complementary signals has a normal phase, while, the other of the complementary signals has an opposite phase, thus, the laser driver 1 may be driven by the differential signal, or the differential circuit 20.

The laser driver 1 provides two input terminals, $V_{IN}$ and $V_{IP}$, each receiving the input signals complementary to each other. That is, two input terminals, $V_{IN}$ and $V_{IP}$, receive the normal signal and the opposite signal. The normal signal is constituted with a DC offset voltage $V_{GS}$ superposed by a normal phase pulse whose amplitude is $V_{amp}$; while, the opposite signal comprises on the DC offset voltage $V_{GS}$ superposed by an opposite phase pulse, the amplitude of which is also $V_{amp}$ but the phase thereof is opposite to the former one. The DC offset voltage $V_{GS}$ may be externally supplied.

Two input terminals are coupled with FETs, 2a and 2b, with the enhancement configuration, respectively. Between the gate electrodes of these FETs, 2a and 2b, is provided with the terminator 3 to terminate the input terminals, $V_{IN}$ and $V_{IP}$. The DC offset voltage $V_{GS}$ superposed on the input signals may be internally provided from a midpoint of this terminator. That is, the DC offset voltage $V_{GS}$ may be generated by, dividing the terminator into two resistors having the same resistance, and the midpoint node of these two resistors may provide the DC offset voltage $V_{GS}$.

Two E-FETs, 2a and 2b, are connected in parallel to each other, and coupled also in parallel to the LD 6. That is, the source electrodes of two E-FETS and the cathode of the LD 6 are grounded, while, the drain electrodes of two E-FETS and the anode of the LD 6 are coupled with the external current source 5 through the inductor 7 to cut the high frequencies contained in the input signals.

The first E-FET 2a switches the first current $I_{ta}$ in accordance with the normal phase signal, while, the second E-FET 2b switches the second current $I_{tb}$ in accordance with the opposite phase signal. The first current $I_{ta}$ and the second current $I_{tb}$ are complementary to each other because the currents, $I_{ta}$ and $I_{tb}$, are based on the complementary signal.

According to the embodiment shown in FIG. 1, the sizes of these two E-FETs, 2a and 2b, are set to be different from each other. The size of the FET may correspond to the gate width FET when two FETs to be compared have the same gate length. That is, in the present embodiment, the gate width of the first E-FET 2a is wider than the gate width of the second E-FET. Assuming a case where the currents, $I_{ta}$ and $I_{tb}$, flowing in respective E-FETs, 2a and 2b, correspond to the zero amplitude of the input signals, $V_{amp}=0$; the current $I_{LD}$ flowing in the LD 6 becomes:

$$I_{LD} = I_B - (I_{ta} + I_{tb})$$
$$= I_B - I_{ta}(1 + D_b/D_a),$$

where $D_a$ and $D_b$ ($D_a > D_b$) are the gate size of respective FETS, 2a and 2b.

Even in a case where the amplitude, $V_{amp}$, of the input signal becomes substantial and the current $I_{ta}$ for the first E-FET 2a becomes $I_{ta}+\Delta I_{ta}$, while, the current $I_{tb}$ for the second E-FET 2b becomes $I_{tb}-\Delta I_{tb}$, because the signals applied to the FETs are complementary to each other; the current $I_{LD}$ flowing in the LD 6 becomes:

$$I_{LD} = I_B - (I_{ta} + \Delta I_{ta} + I_{tb} - \Delta I_{tb})$$
$$= I_B - \{I_{ta}(1 + D_b/D_a) + \Delta I_{ta}(1 - D_b/D_a)\}.$$

Setting the size of the second FET 2b small enough compared with the first FET 2a, namely, $D_b/D_a \sim 0$, the current $I_{LD}$ flowing in the LD 6 may be substantially determined by the first FET 2a.

Because the sizes of respective FETs, 2a and 2b, are far different from each other, the junction capacitance of these FETs, 2a and 2b, becomes different. The capacitor 4 connected between the negative input terminal $V_{IP}$ and the ground may compensate this difference. Because the junction capacitance of an FET unrestricted to the E-FET, 2a or 2b, of the present embodiment is far small compared with the capacitance of a capacitor for bypassing high frequency signals ordinarily connected to the terminator, the capacitor 4 may be integrally formed with the FETs, 2a and 2b, and the terminator 3 as an integrated circuit. In an alternative to the capacitor 4, the gate width of the second FET 2b may be adjusted to compensate the difference of the junction capacitance.

Moreover, the laser driver 1 and the LD may be enclosed within a package 10 with the inductor 7. The laser driver 1, the current source 5 and, occasionally, the differential circuit 20 constitute an optical transmitter. Continuous requests to set the optical device small without degrading the optical performance brings a solution where only a discrete transistor, not an integrated circuit, is installed in a vicinity of the LD within the package. Because the differential circuit 20 of the embodiment shown in FIG. 1 drives the laser driver 1 installed within the package 10 by the differential signal and the transmission lines connecting the differential circuit 20 with the laser driver 1 are terminated by the terminator 3 with the capacitor 4 to compensate the input capacitance of the laser driver 1, the waveform of the differential signal, especially, that of the normal phase signal may be secured.

Figure 3:
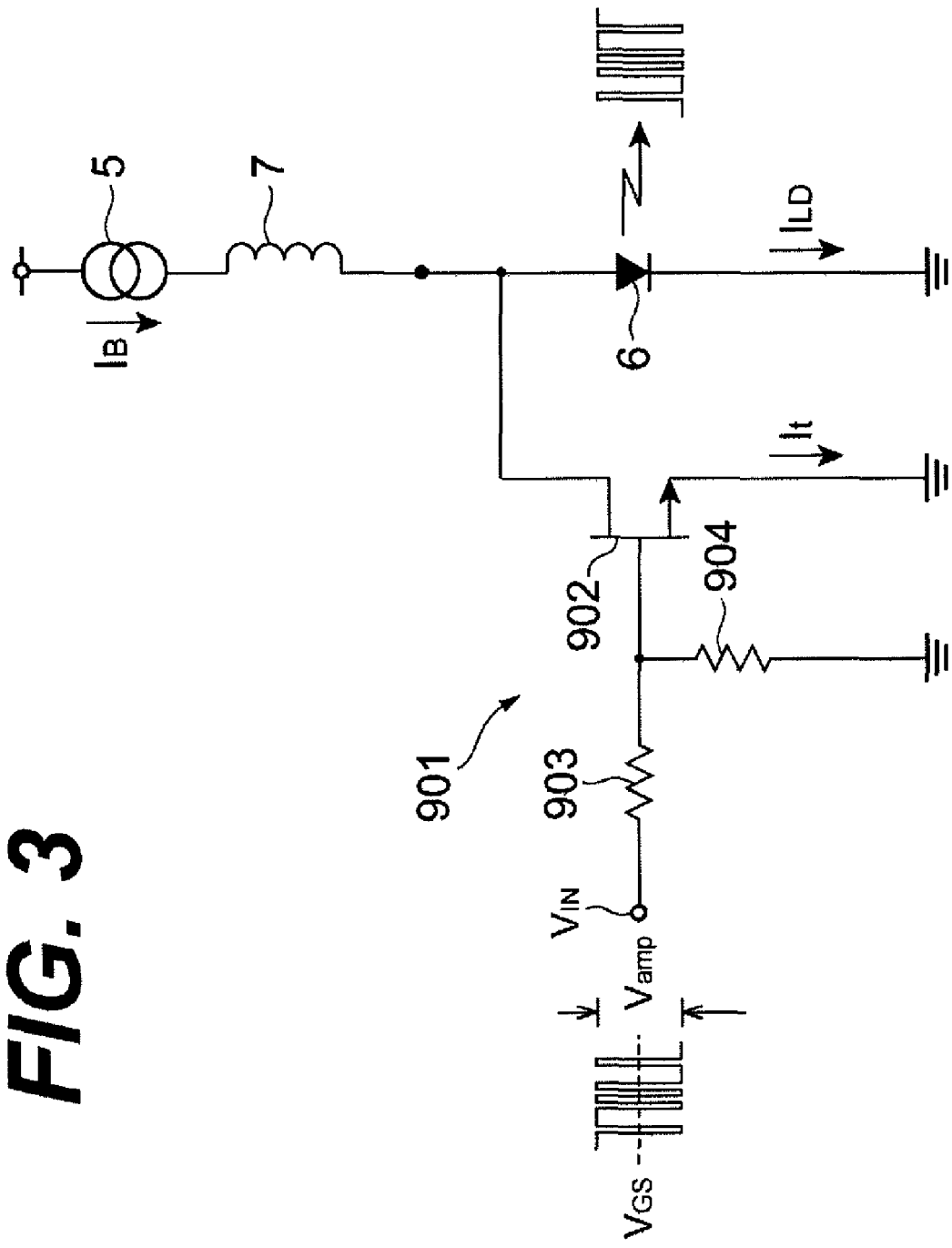
FIG. 3 is a block diagram of a conventional laser driver configured with a single transistor.

Comparing the embodiment of the present invention shown in FIG. 1 with a conventional driver shown in FIG. 3, the conventional laser driver 901 includes an E-FET 902 whose gate electrode receives an input signal with the DC offset voltage $V_{GS}$ and the pulse amplitude $V_{amp}$, which is applied to the input terminal $V_{IN}$, through a series resistor 903, a resistor 904 connected between the gate electrode of the E-FET. The series resistor 903 and the other resistor 904 constitute the terminator for the input signal. The E-FET 902, which is connected in parallel to the LD 6, shunts the current $I_B$ externally applied to the driver 901, thus, the FET 902 modulates the LD 6 by the input signal applied to the terminal $V_{IN}$. The current flowing in the LD 6 becomes:

$$I_{LD}=I_B-It,$$

where It is the current flowing in the FET 902.

When an n-type FET with the enhancement configuration whose threshold voltage is selected in, for instance, 0.4 to 0.7 V, is set in the driver 901, a positive DC offset voltage $V_{GS}$, for instance, about 0.3 V greater than the threshold voltage, $V_{GS}$+ 0.3=0.7 to 1.0 V, is necessary to be superposed on the input signal. The transmission line connecting the driver with the laser driver 901 usually provides the transmission impedance of 50Ω, accordingly; the terminator constituted by two resistors, 903 and 904, is necessary to have the resistance of 50Ω to restrict the reflection of the signal due to the impedance mismatching. As a results, the current flowing in two resistors, 903 and 904, due to the DC offset voltage $V_{GS}$ reaches or sometimes exceeds 14 to 20 mA, which is equivalent to a half or a quarter of the current $I_{LD}$, flowing in the LD. Thus, the power consumption of the laser driver 901 increases.

When the resistor 904 is grounded through a capacitor, the static power consumption, namely, the power consumption at no pulsed input signal may be reduced. However, the capacitance of such a capacitor becomes necessary to be large enough not to affect the frequency response of the terminator, which becomes occasionally greater than 0.1 μF. A larger capacitance is preferable not to degrade the frequency response, in particular, the response in low frequencies of the terminator. A capacitor with huge capacitance greater than several tens of nano-farads is generally impossible to be integrated with in an IC and is necessary to be set outside of the IC, which requests a bonding wire electrically connecting the IC with the outside capacitor and increases the inductance of the bonding wire. Thus, the frequency response of the terminator degrades.

The laser driver 1 shown in FIG. 1 according to an embodiment of the invention provides two FETs, 2a and 2b, with the enhancement configuration and driven by the signals complementary to each other so as to shunt the current $I_B$ supplied from the external current source. The input terminals, $V_{IN}$ and $V_{IP}$, are terminated by the terminator connected between the terminals. Assuming that the resistance of the terminator is $R_T$ and the magnitude of the pulsed input signal is $\Delta V$, the power consumption at the terminator becomes $\Delta V^2 \times R_T \times 2$, which is independent of the magnitude of the DC offset voltage $V_{GS}$. Thus, the power consumption at the terminator by the DC offset voltage may be ignored. Moreover, the size of the first E-FET 2a is set to be large enough compared with that of the other E-FET 2b, which may reduce the current ineffective to modulate the LD 6. The laser driver of the present embodiment is unnecessary to integrate a capacitor with the large capacitance to ground the terminator in the AC mode within an IC and any bonding wires to couple the external capacitor with the IC, which may not only stabilize the frequency performance of the terminator but also reduce the EMI (electro-magnetic interference) noise because the laser driver is driven with the differential signal.

Figure 4A:
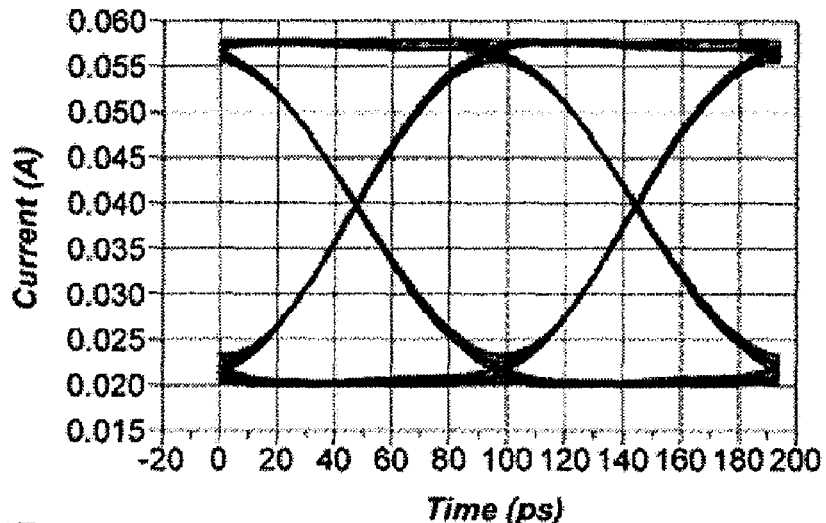
FIG. 4A to 4C are eye diagrams of the driving current generated by the conventional laser driver, in which the inductance of the bonding wire connecting the input bypassing capacitance with the terminator are varied from zero to 1.2 nH.
Figure 4B:
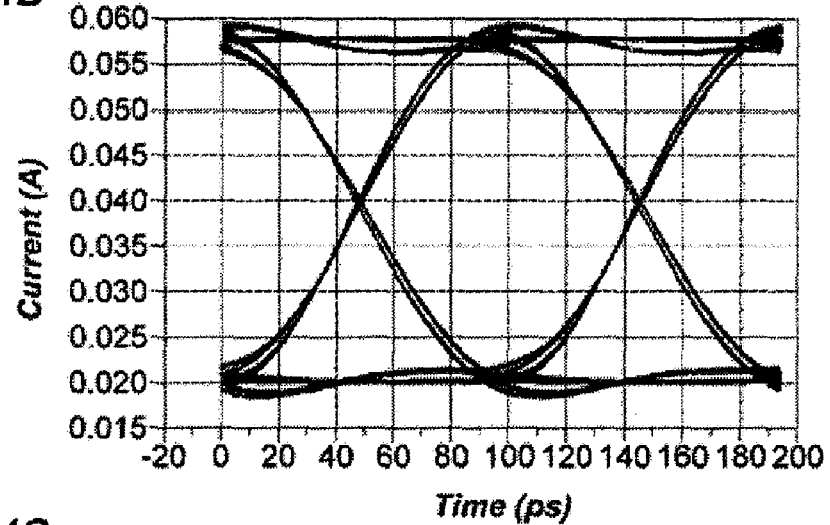
Figure 4C:
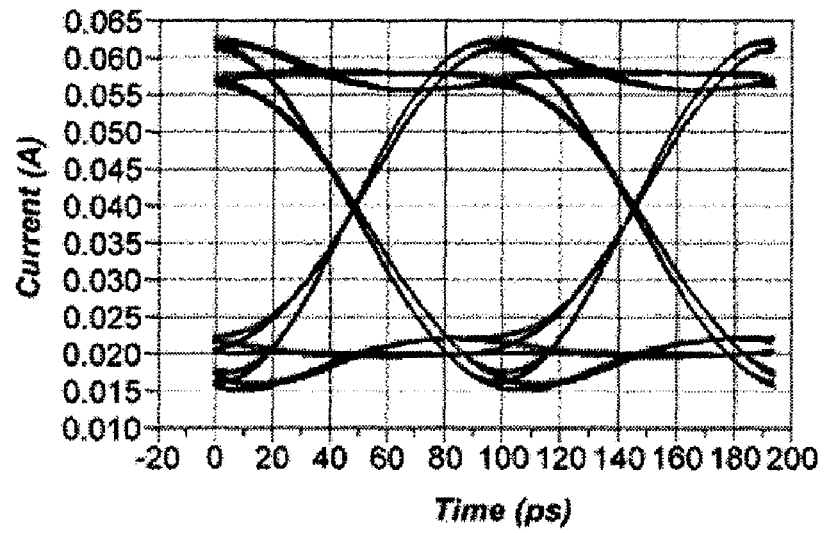

FIGS. 4A to 4C show the current response of the conventional laser driver 901 shown in FIG. 3, which are the calculated results. FIGS. 4A to 4C assume cases where the inductance LT of the bonding wire set between the capacitor and the terminator is LT=0 nH, 0.6 nH, and 1.2 nH, respectively; the external current source 5 provides the current $I_B$ of 80 mA; the DC offset voltage is $V_{GS}$=0.9 V; and the magnitude of the pulsed input signal is $V_{amp}$=300 m$V_{p-p}$. As shown in FIGS. 4A to 4C, when the parasitic inductance $L_T$ is small, the driving current supplied to the LD shows a preferable response, but shows overshoots and undershoots as the inductance $L_T$ increases. As a result, various parameters, such as the opening in the eye diagram and the jitter, degrade. Because the parasitic inductance becomes around 1 nH when the bonding wire has a length of 1 mm and a mil diameter of 1 mil, the conventional laser driver inevitably degrades the output waveform.

Figure 2:
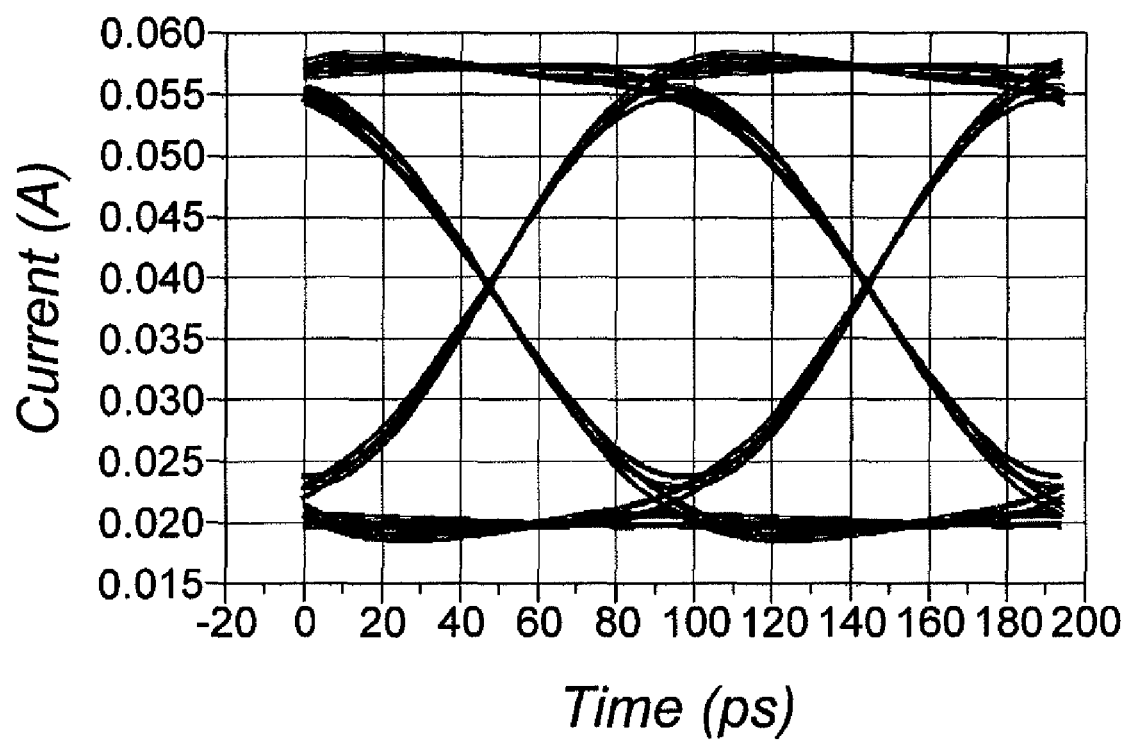
FIG. 2 is an eye diagram of the driving current for the laser diode generated by the laser driver of the present embodiment.

FIG. 2 shows a calculated result of the driving current flowing in the laser driver of the present embodiment shown in FIG. 1. In this case, the external current source provides the current of $I_B$=81 mA, the input offset voltage of $V_{GS}$=0.91 V, the magnitude of the pulsed input signal of $V_{amp}$=310 m$V_{p-p}$ are assumed for securing the condition same with those attributed with the case of FIGS. 4A to 4C. Moreover, further assumptions are set, in which the terminator 3 has the resistance of 100Ω, the size ratio of two FETs, 2a and 2b, is $D_b/D_a$=30, and the capacitance of the capacitor 4 is 20 fF. That is, in order to get the same modulating condition with that of the conventional laser driver 901, the supplied current $I_B$ increases by 1 mA, the magnitude of the input pulse $V_{amp}$ increases by 10 m$V_{p-p}$, which is equivalent to the current of 0.4 mA for the resistance of 25Ω.

Thus, the capacitor to ground the terminator in the AC mode may be eliminated by increasing the current consumption only by a few milli-ampere compared with the conventional driver, which may also eliminate the bonding wire connecting the external capacitor with the IC; and by arranging two transistors driven by a complementary signal and with sizes different from each other, which may effectively reduce the EMI noise compared with the conventional driver where the single transistor is driven by the mono-phased signal.

The foregoing is illustrative of the present invention, and is not to be construed as limiting thereof. Therefore, the invention is defined by the following claims, with equivalents of the claims to be included therein.

What is claimed is:

1. A laser driver to drive a semiconductor laser diode, said driver being driven by signals complementary to each other, comprising:
    a first transistor with an enhancement type for receiving one of said signals with a normal phase, said first transistor being connected in parallel to said laser diode;
    a second transistor with said enhancement type, for receiving another one of said signals with an opposite phase, said second transistor being connected in parallel to said laser diode and having a size smaller than a size of said first transistor; and
    a terminator connected between a control electrode of said first transistor and a control electrode of said second transistor.

2. The laser driver according to claim 1,
    further comprising a capacitor connected to said control electrode of said second transistor.

3. The laser driver according to claim 2,
    wherein said capacitor has capacitance equivalent to a difference between junction capacitance of said first transistor and junction capacitance of said second transistor.

4. The laser driver according to claim 1,
    wherein said first transistor further including two current electrodes, said control electrode of said first transistor controlling a current flowing between said two current electrodes of said first transistor;
    wherein said second transistor further including two current electrodes, said control electrode of said second transistor controlling a current flowing between said two current electrodes of said second transistor; and
    wherein one of said current electrodes of said first transistor and one of said current electrodes of said second transistor are commonly connected to an anode of said laser diode.

5. The laser driver according to claim 4,
    wherein said one of current electrodes of said first transistor, said one of current electrodes of said second transistor, and said anode of said laser diode receives a bias current provided from a constant current source equipped out of said laser driver through an inductor,
    wherein said bias current is shunted to said laser diode, said first transistor, and said second transistor.

6. The laser driver according to claim 1,
    wherein said first transistor and said second transistor are n-type MOS transistor with an equal gate length but gate widths different from each other.

7. The laser driver according to claim 6,
    wherein said gate width of said first transistor and said gate width of said second transistor have a ratio greater than 30.

8. The laser driver according to claim 1,
    wherein said control electrode of said first transistor and said control electrode of said second transistor are positively biased.

9. An optical transmitter, comprising:
    a semiconductor laser diode;
    a laser driver configured to drive said laser diode, said laser driver being driven with differential signals complementary to each other;

a current source configured to supply a bias current to said laser diode; and a package configured to enclose said laser diode and said laser driver therein but exclude said current source, said package having two input terminals for receiving said differential signals and a current terminal for receiving said bias current, wherein said laser driver includes two transistors, a terminator, and a capacitor, said two transistors having respective sizes different from each other, one of said two transistors receiving one of said differential signals with a normal phase through said one of input terminals of said package, and another of said two transistors receiving another of said differential signals with an opposite phase through said another one of input terminals of said package, said terminator being connected between said two input terminals, said capacitor connected to said another one of said input terminals of said package, and wherein said bias current is shunted to said laser diode and said two transistors in accordance with said differential signals.

10. The optical transmitter according to claim 9,
wherein said capacitor has capacitance to compensate a difference in a junction capacitance between one of said two transistors and another one of said two transistors.

11. The optical transmitter according to claim 10,
wherein said sizes of said two transistors have a ratio greater than 30.

\* \* \* \* \*